United States Patent
Abdul et al.

(10) Patent No.: US 11,507,721 B2
(45) Date of Patent: Nov. 22, 2022

(54) SCAN CHAIN WIRELENGTH OPTIMIZATION USING Q-LEARNING BASED REINFORCEMENT LEARNING

(71) Applicant: INTERNATIONAL BUSINESS MACHINES CORPORATION, Armonk, NY (US)

(72) Inventors: Naiju Karim Abdul, Babusapalaya (IN); Rahul M Rao, Bangalore (IN); George Antony, Cochin (IN)

(73) Assignee: International Business Machines Corporation, Armonk, NY (US)

( * ) Notice: Subject to any disclaimer, the term of this patent is extended or adjusted under 35 U.S.C. 154(b) by 127 days.

(21) Appl. No.: 17/031,977

(22) Filed: Sep. 25, 2020

(65) Prior Publication Data
US 2022/0100936 A1    Mar. 31, 2022

(51) Int. Cl.
*G06F 30/30*    (2020.01)
*G06F 30/333*    (2020.01)
(Continued)

(52) U.S. Cl.
CPC .......... *G06F 30/333* (2020.01); *G06F 30/337* (2020.01); *G06F 30/347* (2020.01);
(Continued)

(58) Field of Classification Search
CPC .... G06F 30/333; G06F 30/337; G06F 30/347; G06K 9/6276; G06K 9/6277; G06N 20/00
See application file for complete search history.

(56) References Cited

U.S. PATENT DOCUMENTS

| | | |
|---|---|---|
| 6,199,183 B1 | 3/2001 | Nadaoka |
| 9,015,543 B2 | 4/2015 | Huang |

(Continued)

FOREIGN PATENT DOCUMENTS

CN    106874601 A    6/2017

OTHER PUBLICATIONS

ADL, www.freecodecamp.org/news/an-introduction-to-q-learning-reinforcement-learning-14ac0b4493cc/, "An introduction to QLearning: reinforcement learning", Sep. 3, 2018 / #Machine Learning, 16 pages.

(Continued)

*Primary Examiner* — Jack Chiang
*Assistant Examiner* — Brandon Bowers
(74) *Attorney, Agent, or Firm* — Jordan Schiller

(57) ABSTRACT

A method, a computer system, and a computer program product for scan chain wirelength optimization is provided. Embodiments of the present invention may include obtaining root nodes details from the root nodes. Embodiments of the present invention may include optimizing a connectivity of the root nodes. Embodiments of the present invention may include identifying a best start node and a best end node for each of the root nodes. Embodiments of the present invention may include optimizing child nodes in each of the root nodes. Embodiments of the present invention may include determining that a wirelength of a full tour is shorter or longer than a nearest neighbor. Embodiments of the present invention may include applying or skipping a solution.

17 Claims, 9 Drawing Sheets

(51) Int. Cl.
G06F 30/337 (2020.01)
G06N 20/00 (2019.01)
G06K 9/62 (2022.01)
G06F 30/347 (2020.01)

(52) U.S. Cl.
CPC ......... G06K 9/6276 (2013.01); G06K 9/6277 (2013.01); G06N 20/00 (2019.01)

(56) References Cited

U.S. PATENT DOCUMENTS

| | | | |
|---|---|---|---|
| 10,216,885 B2 | 2/2019 | Gopalakrishnasetty | |
| 10,338,139 B1 | 7/2019 | Ge | |
| 10,417,363 B1 | 9/2019 | Kaur | |
| 2003/0149927 A1* | 8/2003 | Wang | G06F 11/27 714/E11.169 |
| 2019/0220776 A1 | 7/2019 | Huang | |
| 2020/0004913 A1* | 1/2020 | Goel | G06N 20/00 |

OTHER PUBLICATIONS

Lawler et al., "The Traveling Salesman Problem: A Guided Tour of Combinatorial Optimization", 1985, Publisher: Wiley, Book 476 pages, 6 pages.

Mell et al., "The NIST Definition of Cloud Computing", Recommendations of the National Institute of Standards and Technology, Special Publication 800-145, Sep. 2011, 7 pages.

Paul et al., "Genetic Algorithm based Scan Chain Optimization and Test Power Reduction using Physical Infomnation", 2006 IEEE, 4 pages.

Ma et al., "Clustered Reinforcement Learning", Jun. 7, 2019, 16 pages.

Mannor et al., "Dynamic Abstraction in Reinforcement Learning via Clustering", ICML '04: Proceedings of the twenty-first international conference on Machine learning, Jul. 2004, 12 pages.

Abdul, et al., "Scan Chain Wirelength Optimization Using Q-Learning Based Reinforcement Learning," Application and Drawings, Filed on Aug. 31, 2021, 39 Pages, Related US Patent Application Serial No. 102021122558.2.

Abdul, et al., "Scan Chain Wirelength Optimization Using Q-Learning Based Reinforcement Learning," Application and Drawings, Filed on Sep. 15, 2021, 43 Pages, Related US Patent Application Serial Mo. 2113146.1.

Abdul, et al., "Scan Chain Wirelength Optimization Using Q-Learning Based Reinforcement Learning," Application and Drawings, Filed on Sep. 24, 2021, 33 Pages, Related US Patent Application Serial No. 202111120826.8.

Abdul, et al., "Scan Chain Wirelength Optimization Using Q-Learning Based Reinforcement Learning," Application and Drawings, Filed on Sep. 24, 2021, 37 Pages, Related US Patent Application Serial No. 2021-156026.

Intellectual Property Office, "Patents Act 1977: Search Report under Section 17," Patents Directorate, dated Jan. 17, 2022, 4 pages, GB Application No. 2113146.1.

* cited by examiner

SCAN CHAIN WIRELENGTH OPTIMIZATION USING Q-LEARNING BASED REINFORCEMENT LEARNING

BACKGROUND

The present invention relates generally to the field of computing, and more particularly to scan chain optimization using machine learning. Using a scan chain technique can simplify integrated circuit testing by providing controllability and observability at each flip-flop in the integrated circuit based on a set of signals transmitted. Scan chain optimization methodology includes re-ordering the scan chain through the set of flip-flops subject to multiple constraints including a total wirelength scan. Latches or flip-flops may be distributed among multiple scan chains.

SUMMARY

Embodiments of the present invention disclose a method, a computer system, and a computer program product for scan chain wirelength optimization. Embodiments of the present invention may include obtaining root nodes details from the root nodes. Embodiments of the present invention may include optimizing a connectivity of the root nodes. Embodiments of the present invention may include identifying a best start node and a best end node for each of the root nodes. Embodiments of the present invention may include optimizing child nodes in each of the root nodes. Embodiments of the present invention may include determining that a wirelength of a full tour is shorter or longer than a nearest neighbor. Embodiments of the present invention may include applying or skipping a solution.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION

Figure 1:
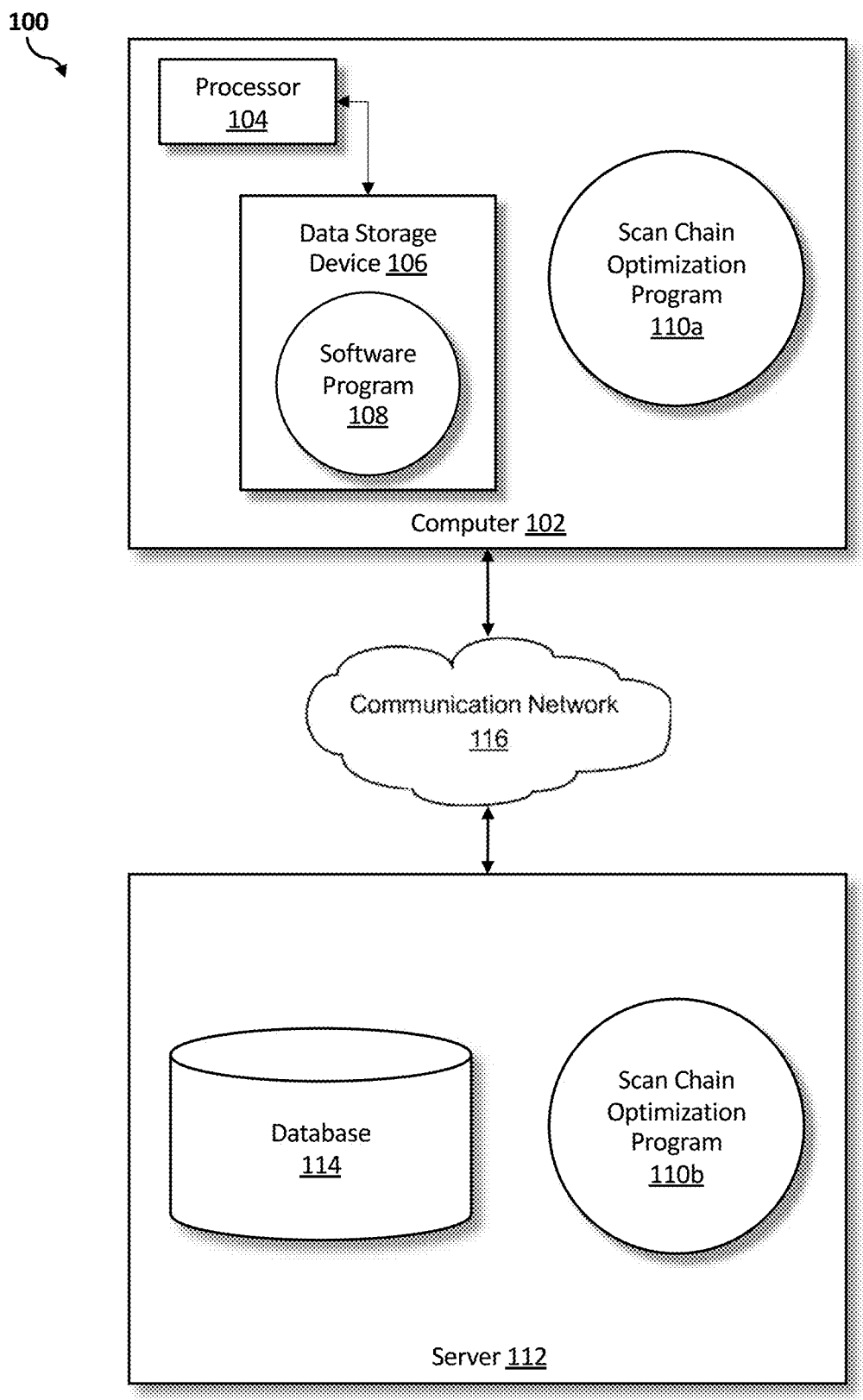
FIG. 1 illustrates a networked computer environment according to at least one embodiment.

Detailed embodiments of the claimed structures and methods are disclosed herein, however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

As previously described, using a scan chain technique can simplify integrated circuit testing by providing controllability and observability at each flip-flop in the integrated circuit based on a set of signals transmitted. Scan chain optimization methodology includes re-ordering the scan chain through the set of flip-flops subject to multiple constraints including a total wirelength scan. Latches or flip-flops may be distributed among multiple scan chains.

One primary objective of scan chain optimization is to reduce the wirelength of the scan chain. A reduced wirelength increases scan frequency, improves test time, and improves design rout-ability, which results in a reduced chip area and power. Current scan chain optimization solutions may include methods using a greedy approach using the nearest neighbor node and then augment the nodes with swaps between chains or nodes. Another method includes exhaustive searches that have many combinations that make the testing infeasible. Some use genetic algorithm type of approaches. Current scan chain optimization ordering to reduce wirelength do not incorporate a Q-learning approach to re-order the scan chain for a reduced wirelength. Therefore, it may be advantageous to, among other things, create an improved scan chain wirelength optimization method to reduce the total wirelength and power by using Q-learning to reconnect scan nets.

The following described exemplary embodiments provide a system, a method and a program product for scan chain optimization. As such, embodiments of the present invention have the capacity to improve the technical field of scan chain optimization by using a Q-learning based reinforcement learning to optimize the scan chain wirelength. More specifically, an efficient and re-ordered scan chain may be identified by integrating and using multiple permutations of nodes that are in the existing scan chain. An efficient reordering of the scan chain may use guidance learning that is obtained from previous explorations and the guidance is weighted or rewarded based on the total chain wirelength from each exploration.

Q-learning is a reinforcement learning algorithm that is model free and is off policy. Model free refers to not requiring a model to perform an action. Q-learning may have the ability to work with stochastic transitions and rewards and not requiring adaptations. Off policy may refer to the ability to learn an algorithm that finds a best action based on a current state. Q-learning functions may learn based on actions that are outside of a policy, for example, taking random actions. Reinforcement learning may refer to an area of machine learning that takes actions based on a reward or a cumulative reward.

Latches or flip-flops may be distributed among multiple scan chains to minimize the number of latches in each scan chain, which may directly reduce the scan time and, thus, also reduce the test time. A basic scan chain structure may scan the signals in order. A scan chain designed at the register transfer level (RTL) may have scan latches assigned to a scan chain in a random order or in a logical order that is unaware of the physical location of the latches.

A scan chain optimization may run during the physical design optimization of the integrated circuit (IC) after the latch locations are determined on the chip. During optimization, the scan output of a first latch is connected to the scan input of a second latch serially, forming a chain. The total wirelength may be defined as the sum of the distance between every pair of latches on the scan chain. Scan chain optimization may also limit latches in each scan chain to reduce the test time. Each scan latch may be assigned to one of the scan chains. Each latch may occur on any one of the scan chains once, and every latch may occur on at least one scan chain. Scan optimization may refer to the reconnection of the scan chain through the latches to reduce the total wirelength and power.

According to an embodiment, Q-learning may be used to perform many iterations to obtain a Q-table that is optimal or what may be considered a good Q-table. A good Q-table may be a representation of the best action for a given state. A Q-table may be a lookup table that captures the calculated maximum expected future rewards for an action at each state. After the initialization of a Q-table, many iterations may be taken during the reinforcement learning that include multiple steps to improve the Q-table. The iteration steps may include, for example, choosing an action, performing the action, measuring the result, quantifying the reward and then updating the Q-table. A new Q value for a state and an action may be represented by New $Q(s,a)$. The current Q value may be represented by $Q(s,a)$. The learning rate may be represented by $\alpha$. The reward for taking an action at the given state may be represented by $R(s,a)$. The discount rate may be represented by $\gamma$. The maximum expected future reward given a new state, $s'$, and all possible actions at the new state may be represented by $maxQ'(s',a')$. An equation that represents the iteration steps may include, for example, New $Q(s, a)=Q(s, a)+\alpha[R(s, a)+\gamma\ maxQ'(s', a')-Q(s, a)]$.

According to an embodiment, a Q-learning based reinforcement learning algorithm may be used to find connectivity for scan stitching. An iterative Q-learning method may be used for a scan chain reorder. A scan chain reorder may include reconnecting the scan nets based on the physical location of the latches to reduce the overall scan wirelength.

According to an embodiment, test requirements may be incorporated as constraints when guiding Q-learning. The constraints may be the total latches in any single scan chain and should not exceed a design for testability (DFT) limit. The constraints may also be latches associated with a given local clock buffer (LCB) cluster that should be grouped together. The constraints may additionally be a scan chain order of certain latches that are marked as non-optimizable and need to be maintained as is. The optimal scan chain connectivity may be partitioned into inter and intra cluster explorations. For example, the latch nodes may be partitioned as an inter cluster (e.g., root node) optimization followed by an intra cluster (e.g., child node) optimization.

According to an embodiment, a recursive application of Q-learning may be used with root nodes and child nodes. An in-context determination may be made relating to the optimal start point and the optimal end point for the child nodes.

According to an embodiment, node collapsing may be used to reduce the state space to enable more iterations and more explorations. Enabling node collapsing may also be used to uphold specific no-optimizations and to uphold design for testability (DFT) constraints to keep groups of latches together in a local clock buffer (LCB) cluster.

According to an embodiment, a zero-discount rate may be provided since all possible actions may be estimated from the new state, which may be time intensive and exhaustive.

Referring to FIG. 1, an exemplary networked computer environment 100 in accordance with one embodiment is depicted. The networked computer environment 100 may include a computer 102 with a processor 104 and a data storage device 106 that are enabled to run a software program 108 and a scan chain optimization program 110a. The networked computer environment 100 may also include a server 112 that is enabled to run a scan chain optimization program 110b that may interact with a database 114 and a communication network 116. The computer 102 may also be known as a client computer and the server 112 may also be known as a server computer. The networked computer environment 100 may include a plurality of computers 102 and servers 112, only one of which is shown. The communication network 116 may include various types of communication networks, such as a wide area network (WAN), local area network (LAN), a telecommunication network, a wireless network, a public switched network and/or a satellite network. It should be appreciated that FIG. 1 provides only an illustration of one implementation and does not imply any limitations with regard to the environments in which different embodiments may be implemented. Many modifications to the depicted environments may be made based on design and implementation requirements.

The computer 102 may communicate with the server 112 via the communications network 116. The communications network 116 may include connections, such as wire, wireless communication links, or fiber optic cables. As will be discussed with reference to FIG. 4, server 112 may include internal components 902a and external components 904a, respectively, and computer 102 may include internal components 902b and external components 904b, respectively. The server 112 may also operate in a cloud computing service model, such as Software as a Service (SaaS), Analytics as a Service (AaaS), Blockchain as a Service (BaaS), Platform as a Service (PaaS), or Infrastructure as a Service (IaaS). Server 112 may also be located in a cloud computing deployment model, such as a private cloud, community cloud, public cloud, or hybrid cloud. Computer 102 may be, for example, a mobile device, a telephone, a personal digital assistant, a netbook, a laptop computer, a tablet computer, a desktop computer, or any type of computing devices capable of running a program, accessing a network, and accessing a database 114. According to various implementations of the present embodiment, the scan chain optimization program 110a, 110b may interact with a database 114 that may be embedded in various storage devices, such as, but not limited to a computer/mobile device 102, a server 112, or a cloud storage service.

According to the present embodiment, a user using a client computer 102 or a server computer 112 may use the scan chain optimization program 110a, 110b (respectively) to optimize a scan chain wirelength using a Q-learning based reinforcement learning. The scan chain optimization method is explained in more detail below with respect to FIGS. 2A-B and 3A-C.

Figure 2A:
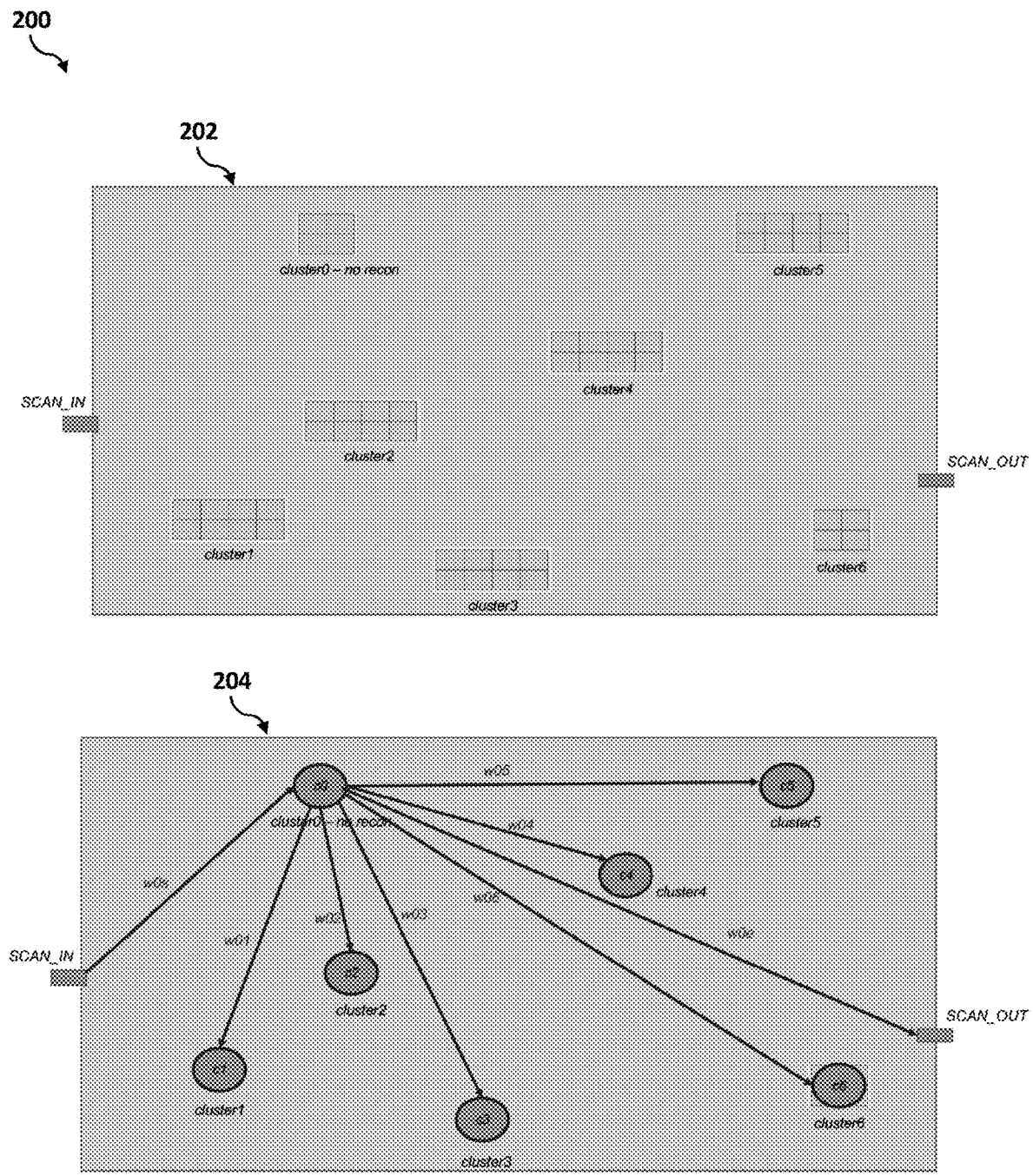
FIGS. 2A and 2B are block diagrams depicting examples of multiple root node representations of clusters according to at least one embodiment.
Figure 2B:
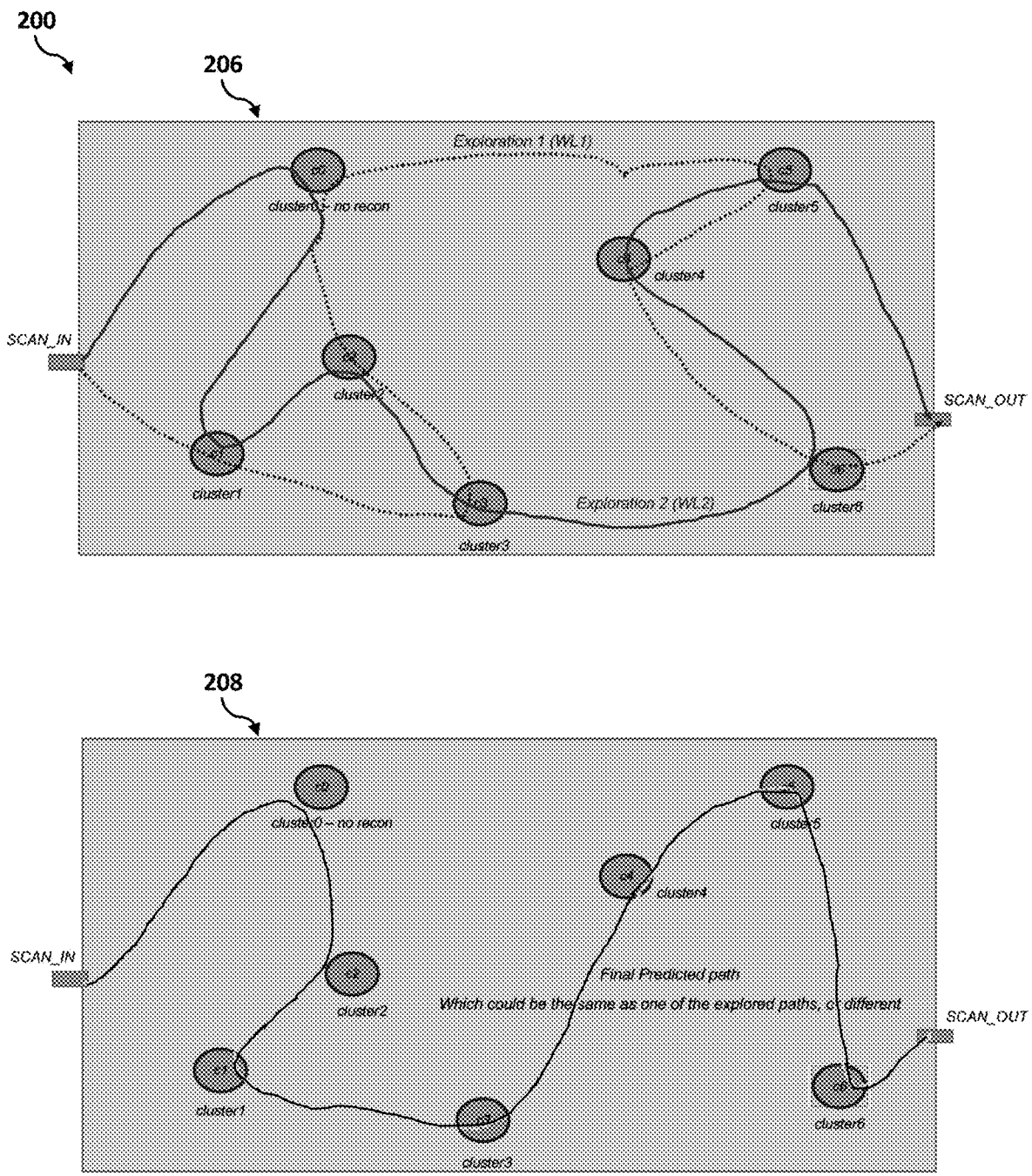

Referring now to FIGS. 2A-B, block diagrams depicting examples of multiple root node representations of clusters used by the scan chain optimization program 110a, 110b according to at least one embodiment is depicted.

At 202, a representation of a design with one scan chain, including a SCAN_IN port and a SCAN_OUT port is shown. The blocks represent latch clusters in the design. For example, there are 7 clusters of latches with cluster0 defined as a non-optimizable cluster.

At 204, a representation of the latch clusters that are collapsed into root nodes are shown. For instance, the four latches identified in cluster 6 at 202 are collapsed into a single root node, c6. A directional edge from root node c0 to node c6 indicates a next allowable state for exploration from c0 to c6. The associated weight on the edge may include the wirelength for taking the path from c0 to c6, which is wirelength w06.

At 206, the root node creation and weights are shown as a Q-learning updated weights or rewards based on wirelength, WL(i), to favor the shortest path. Exploration 1 (WL1) and exploration 2 (WL2) were considered and the path using exploration 2 (WL2) was calculated to be a part of the shortest path. The calculated shortest path is used to update the weights in the Q-table.

At 208, the root node solution after N explorations is shown as the final predicted path with the weights updated based on the N explorations. The final path may be the same path as one of the explored paths, or the final path may differ from the explored paths. The final path may include the shortest wirelength path.

Figure 3A:
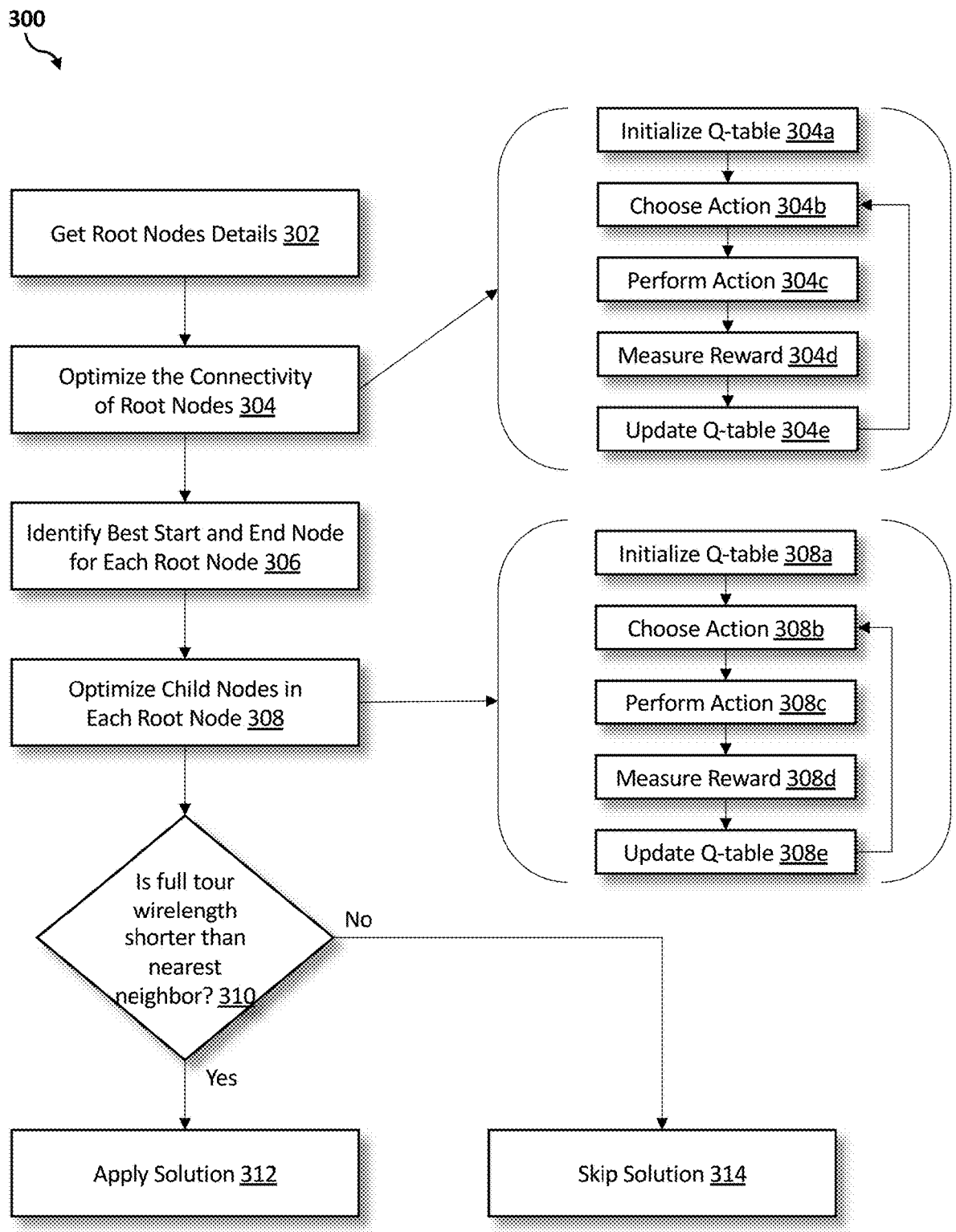
FIG. 3A is an operational flowchart illustrating a process for scan chain wirelength optimization using Q-learning based reinforcement learning according to at least one embodiment.

Referring now to FIG. 3A, an operational flowchart illustrating the exemplary scan chain wirelength optimization process 200 used by the scan chain optimization program 110a, 110b according to at least one embodiment is depicted.

At 302, the operation of get root nodes details is performed. The details obtained from the root nodes may pertain to the connectivity of the root nodes. One or more root nodes may represent, for example, a group of latches in a local clock buffer (LCB) cluster, a group of non-optimizable latches or stand-alone nodes. A root node (RootNode) is a collapsed representation of a group of latches that are required to be constrained together. Reinforcement learning or Q-learning may be used to get the optimal connectivity of root nodes.

At 304, the connectivity of root nodes is optimized. The connectivity of root nodes is optimized to create root node data that will predict a root node tour (RootNodeTour). A root node tour (RootNodeTour) is the optimal connectivity of root nodes that reduces the total wirelength. The optimal Q-table will be used to predict the root node tour (RootNodeTour). A root node tour (RootNodeTour) may be predicted for each node element matrix. Optimizing root nodes may include initializing a Q-table at 304a for the initial operation and then performing many iterations of steps 304b-e. The number of iterations may vary depending on the desired depth of the exploration. The quality of the Q-table may improve as the number of iterations increase. The number of iterations performed may be enough to create an optimal Q-table. For example, one instance of choosing the value of N is choosing the value when the previous explorations have not returned a shorter wirelength (WL) than the previous, N−K, explorations.

Optimizing root node (RootNode) details for a scan chain may include representing the group of latches to a cluster (i.e., a node) with a coordinate that is an average value of all (x,y) latch coordinates in the group.

At 304a, the Q-table is initialized. The Q-table may be initialized by setting the values in the table or in the matrix to zero or to a uniform value across all locations of the table. The table is represented as a state and an action at that state.

At 304b, an action is chosen. The action may be chosen based on a weight between the nodes or the action may be chosen at random. The weight between nodes may be measured by the distance between cluster (i.e., node) points. For example, an input cluster location may be (xi,yi) and another cluster location may be (xo,yo), where representations may include $Xi=(xi)\in \mathbb{R}^{1 \times n}$, $Yi=(yi)\in \mathbb{R}^{1 \times n}$, $Xo=(xo)\in \mathbb{R}^{1 \times n}$, and $Yo=(yo)\in \mathbb{R}^{1 \times n}$. The wirelength (WL) may be computed as $WL=|Xo-Xi|+|Yo-Yi|$.

An action that is selected based on weights may be equal to f(Qcurrent, K/distance) where K is a constant value. Qcurrent is the current value for the state, action pair in the Q-table. The action that is selected based on the weights may include choosing a node with the largest weight evaluated as f(Qcurrent, K/distance) or choosing a node at random from a selection of the closest N nodes from the current node. The process for the choose action portion, 304b, of the Q-learning process during the optimize root nodes (RootNodes) for a scan chain in shown in FIG. 3B.

According to an alternate embodiment, a group of latches within a root node may be represented with a coordinate that is an average value of the midpoint of the scan in and scan out pins in that group.

At 304c, an action is performed. The action may be performed by adding the chosen node from step 304b to the root node tour (RootNodeTour). The sequence of steps 304b and 304c may be repeated until all nodes have been added to the root node tour (RootNodeTour).

At 304d, a reward is measured. At the end of each exploration, the reward is measured by measuring the total wire length of the root node tour (RootNodeTour) as an evaluating metric. For example, the Manhattan distance between the nodes may be used as a metric for the wirelength (WL) measurement and the total wirelength (WL) is compared against the best wirelength (WL) achieved in the previous tour evaluation iterations.

At 304e, the Q-table is updated. The table is updated based on the tour wire length. The Q-table update or the Q update may be represented as *Qnext=(1−∝) Qcurrent+∝ (CurrentWL/GlobalOptWL+γ*max of next state). Qnext is the next action or the action at the next state, ∝ is the learning rate, currentWL is the current wire length at the Qcurrent node, γ is the discount rate, and the max of the next state is the maximum value of Q from all of the next states for the current action.

In a first embodiment, the Q-table is updated based on every iteration represented as CurrentWL<K*GlobalOptWL. For example, if the CurrentWL is less than K*GlobalOptWL, then the Q-table is updated. If CurrentWL is not less than K*GlobalOptWL, then the Q-table updation is skipped.

In a second embodiment, the Q-table is updated based on every iteration represented as CurrentWL<K*GlobalOptWL and the path has never been updated before. For example, if the CurrentWL is less than K*GlobalOptWL, then the scan chain optimization program determines if the node was already rewarded. If the node was already rewarded, then the Q-table is updated. If CurrentWL is not less than K*GlobalOptWL, then the Q-table updation is skipped.

The sequence of steps 304b-304e may be performed N times to continually improve the Q-table. After N iterations or explorations, the optimal root node tour (RootNodeTour)

is selected by starting from the first node and choosing an action based on the current Q-table until the last node in the root node tour (RootNodeTour) is reached. The last root node tour (RootNodeTour) may be called or considered the optimized root node tour (RootNodeTour).

At 306, the best start node and end node is identified. The best start node and the best end node is identified for each root node (RootNode) as an optimal connection between the best start node and end node. For each root node (RootNode), the child nodes are considered as the start nodes and end nodes for an optimal child node tour (ChildNodeTour). The process for the identifying or choosing the best start node and end node or the optimal connection may be referenced in FIG. 3C.

At 308, the child nodes in each root node are optimized. Each node in the root node tour (RootNodeTour) may consist of multiple child nodes. Each node may be optimized to find the optimal tour (OptChildChain) within that root node (RootNode). The process of optimization of child nodes may be similar to that of the root node tour (RootNodeTour) optimization from steps 304b-304e.

After each child node optimizations, the full tour is created by beginning from the start node and traversing through the root node tour (RootNodeTour). At every root node (RootNode), the optimized child node tour (ChildNodeTour) for that root node (RootNode) is appended to the full tour (FullTour) before moving to the next node in the root node tour (RootNodeTour).

At 308a, the Q-table is initialized. A new Q-table for each root node (RootNode) may be initialized, which may represent the current state and action for each child node in that root node (RootNode). For the child node tour (OptChildChain) optimizations, initializing the Q-table includes setting the values in the table or in the matrix to zero or to a uniform value across all locations of the table. Many iterations of steps 308b-e may be performed to obtain a good quality Q-table. The optimization of the various child node tours (OptChildChain) may be done in parallel to save run time.

At 308b, an action is chosen. The action may be chosen based on the fixed or optimal start node and the fixed or optimal end node determination for the node matrix. The action is chosen based on determining the minimum wirelength between the child nodes within the root node (RootNode). The distance between two child nodes may be computed based on the pin locations on the child nodes. The wirelength WL may be computed as WL=|Xo−Xi|+|Yo−Yi|. The action that is selected based on the weights may include choosing a node with the largest weight evaluated as f(Qcurrent, K/distance) or choosing a node at random from a selection of the closest N nodes from the current node. The process for the choose action portion, 308b, of the Q-learning process during the optimize root nodes (RootNodes) for a scan chain in shown in FIG. 3B.

At 308c, an action is performed. The action is performed as in step 304c.

At 308d, a reward is measured. The reward is measured as in step 304d.

At 308e, the Q-table is updated. The Q-table is updated similar to step 308e, however, for the Q-table is updated for each of the child node tours (ChildNodeTours). The sequence of steps 308b-308e may be performed N times to complete the full tour (FullTour). The sequence of steps 308b-308e may be performed N times to continually improve the Q-table. After N iterations or explorations, the optimal child node tour (ChildNodeTour) is selected by starting from the first node and choosing the action based on the current Q-table until the last node in the child node tour (ChildNodeTour) is reached. The sequence of steps and iterations may result in an optimized child node.

If the current node is a cluster node, then the child node tour (ChildNodeTour) may be optimized and appended to the full tour (FullTour). To connect two cluster nodes, the best end node of one cluster and the start node of the next cluster is determined. For each start-end node options, a Q-learning process may be done from the start node to the end node. Then, a best cluster optimized chain (OptChildChain) may be identified. The child node tour (ChildNodeTour) appended to the full tour (FullTour) may be represented as append OptChildChain to FullTour. The start node of the next cluster (OptStartNode) may be identified based on the minimum wirelength (WL) connectivity between the optimal end node (OptEndNode) and the next cluster nodes.

If the current node is a standalone node, such as a start node, an end node or a single node, the standalone node is appended to the full tour (FullTour). The next node may be set as the node with a minimum wirelength (WL) to the current node.

If the current node is a non-optimizable node, then the non-optimizable node is appended in a chain to the full tour (FullTour). The next node may be set by identifying the minimum wirelength (WL) of the next node from the reconnected end node when the current node is equal to the minimum wirelength (WL) of the next node.

At 310, the scan chain optimization program 110a, 110b determines if the full tour wirelength is shorter than the existing nearest neighbor solution. The full tour wirelength that was optimized from step 308 is compared to the wirelength from the nearest neighbor solution. The nearest neighbor may, for example, be an algorithm solution used for solving a scan chain optimization problem where the closest neighbor is chosen at every given step.

If the scan chain optimization program 110a, 110b determined that the full tour wirelength is shorter than the nearest neighbor, then the solution is applied at step 312. The solution that is applied is from the Q-learning based full tour (FullTour). For example, the solution is the full tour wirelength compared to the best known full tour wirelength thus far from all previous explorations.

If the scan chain optimization program 110a, 110b determined that the full tour wirelength is not shorter than the nearest neighbor, then the current path or solution is skipped at 314.

Figure 3B:
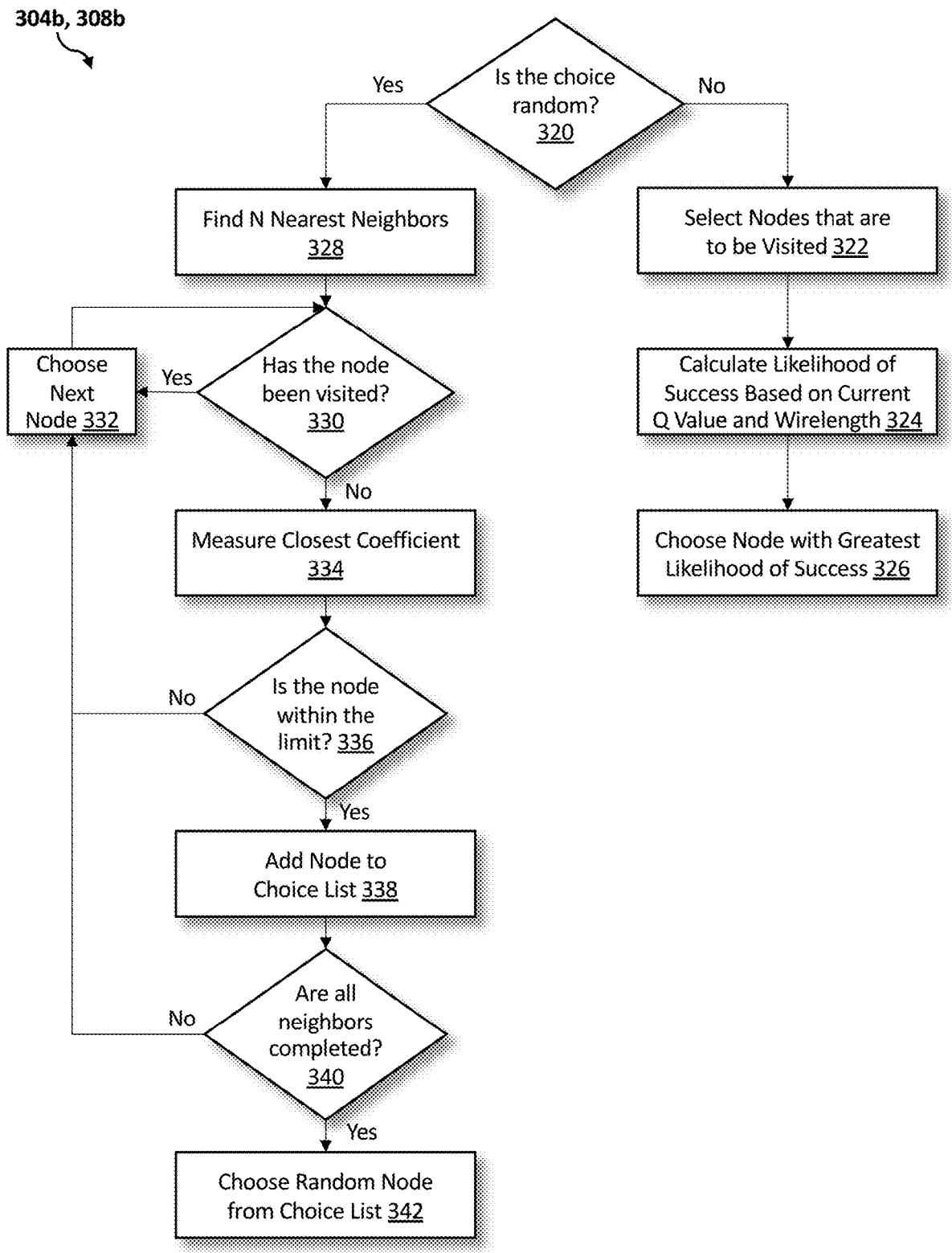
FIG. 3B is an operational flowchart illustrating a process for the choose action portion of the Q-learning process during the optimize root node (OptRootNode) and optimize child node (OptChildChain) connectivity for a scan chain according to at least one embodiment.

Referring now to FIG. 3B, an operational flowchart illustrating the exemplary choose action portion of the Q-learning optimize root node (OptRootNode) and optimize child node (OptChildChain) connectivity process 304b, 308b used by the scan chain optimization program 110a, 110b according to at least one embodiment is depicted. Choosing an action and the next state is shown, where the next state may be represented as action=f(Qcurrent, K/weight) where K is a constant value or the action may be selected at random.

At 320, the scan chain optimization program 110a, 110b determines if the choice is random. The choice may refer to determining if the action that was chosen was a random action based on an exploration coefficient. The exploration coefficient may be any value from 0 to 1, where 1 refers to a maximum randomness and 0 refers to no randomness.

If the scan chain optimization program 110a, 110b determined that the choice was not random, then the nodes that are to be visited are selected at 322. The nodes that are to be visited includes all the nodes that have not yet been visited in the current exploration.

At 324, the likelihood of success is calculated based on a current Q value and wirelength. The Q value and wirelength between nodes are calculated by Q*H, where H is a function of the wirelength between the current node and each of the candidate next nodes.

At 326, a node with the greatest likelihood of success is chosen. The node with the greatest likelihood of success is chosen using the result of the Q*H calculation. For example, the node with the maximum value of Q*H may be calculated to have the maximum likelihood of success.

If the scan chain optimization program 110a, 110b determined that the choice was random, then the N nearest neighbors are found at 328. The N nearest neighbors may be found using N as the number that is defined during the run.

At 328, the N nearest neighbors are found. The N nearest neighbors are found or identified based on a sorted distance of neighbors. For example, the N nearest neighbors distances are sorted from a smallest to a largest distance based on the identified distances from the current node.

At 330, the scan chain optimization program 110a, 110b determines if the node has been visited. A determination is made based on if the node has been visited in the current exploration by checking if the selected node is already a part of or identified in the tour exploration.

If the scan chain optimization program 110a, 110b determined that the node has been visited in the tour, then the next node is chosen at 332. The next node is chosen as one of the remaining nodes from the N nearest neighbors. After the next node is chosen, the scan chain optimization program 110a, 110b determines if the node (e.g., the next node) has been visited on the tour at step 330.

If the scan chain optimization program 110a, 110b determined that the node has not been visited in the tour, then the closest coefficient is measured at 334. For example, a Boltzmann exploration may be utilized to find the closest coefficient of the nearest neighbors.

At 336, the scan chain optimization program 110a, 110b determines if the node is within the limit. The limit may be determined based on the depth of the exploration required in the learning process. A smaller limit may restrict the exploration to close neighbors and a higher limit may explore both close neighbors and farther nodes.

If the scan chain optimization program 110a, 110b determined that the node is not within the limit, then the next node is chosen at 332. After the next node is chosen, the scan chain optimization program 110a, 110b determines if the node (e.g., the next node) has been visited on the tour at step 330.

If the scan chain optimization program 110a, 110b determined that the node is within the limit, then the node is added to the choice list at 338. Determining that the node is within the limit may include checking if the closeness coefficient is less than a predefined or predetermined threshold. The choice list may represent the nodes that can be explored during a random exploration or multiple random explorations that are sufficiently closer to the current node.

At 340, the scan chain optimization program 110a, 110b determines if all of the neighbors are completed. All of the neighbors are completed if all of the N nearest neighbors from step 328 have been evaluated.

If the scan chain optimization program 110a, 110b determined that all of the neighbors are not completed, then the next node is chosen at 332. After the next node is chosen, the scan chain optimization program 110a, 110b determines if the node (e.g., the next node) has been visited on the tour at step 330.

If the scan chain optimization program 110a, 110b determined that all of the neighbors are completed, then a random node is chosen from the choice list. A random node is chosen by picking one of the nodes from the choice list at random.

Figure 3C:
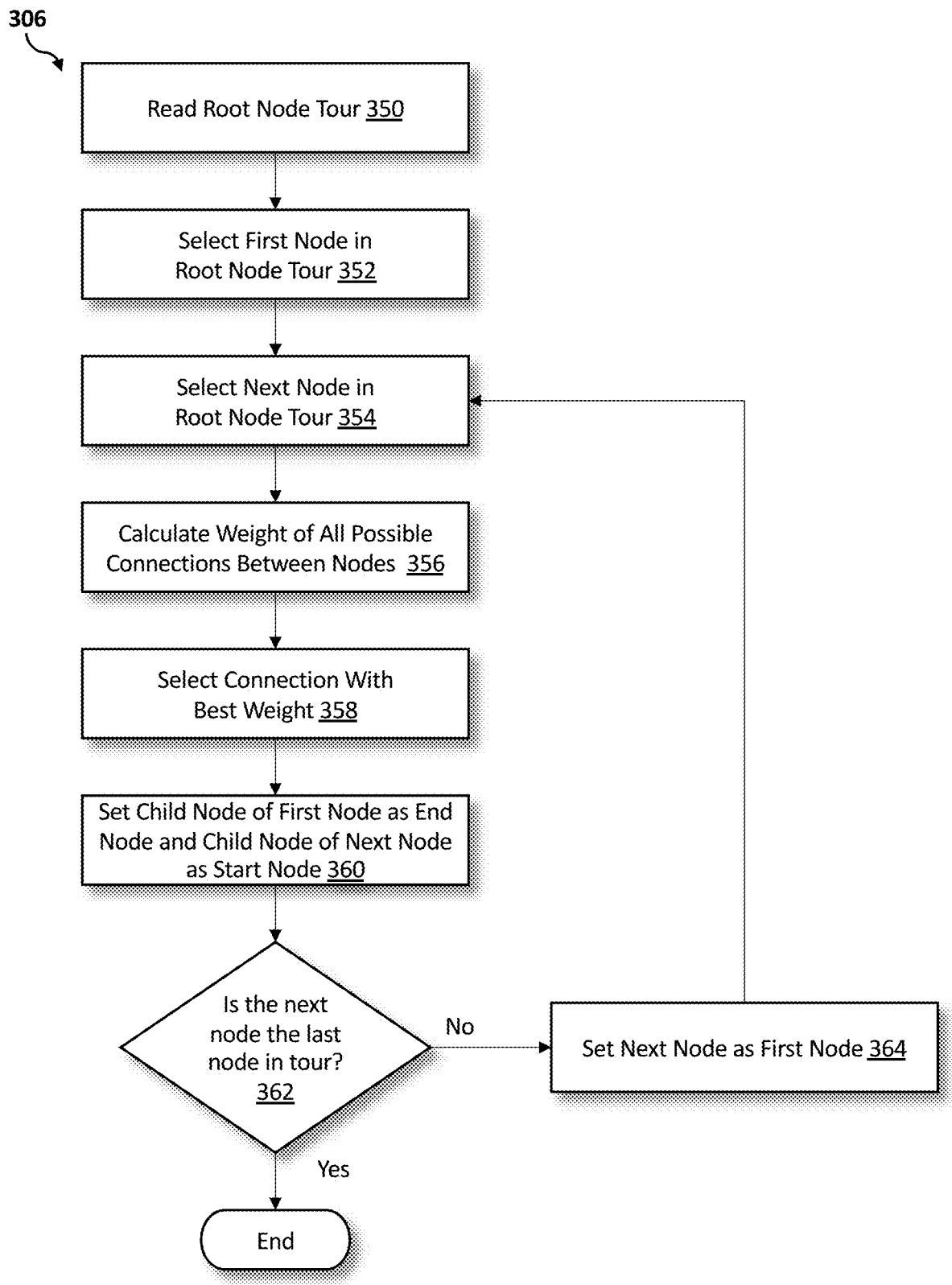
FIG. 3C is an operational flowchart illustrating a process for choosing an optimal connection between root nodes (RootNodes) according to at least one embodiment.

Referring now to FIG. 3C, an operational flowchart illustrating the exemplary choosing an optimal connection between root nodes (RootNodes) process 306 used by the scan chain optimization program 110a, 110b according to at least one embodiment is depicted.

At 350, the root node tour (RootNodeTour) is read or identified. The root node tour (RootNodeTour) is identified based on the Q-table after the Q-table is updated in step 304e.

At 352, the first node in the root node tour (RootNodeTour) is selected. The first node that is selected is the first node on the optimal root node tour.

At 354, the next node (e.g., a second node) in the root node tour (RootNodeTour) is selected. The second node may be set as the node with a largest Q-value from the first node.

At 356, the weight of all possible connections between nodes are calculated. The weights of all possible connections are calculated between the child nodes of the first node in the root node tour (RootNodeTour) and the second node in the root node tour (RootNodeTour). The weight may represent the wirelength (WL) between the nodes and may be computed as the distance between two nodes. As stated in step 308b, $WL=|Xo-Xi|+|Yo-Yi|$.

At 358, the connection with the best weight is selected. The best weight or the optimal weight may be a random choice among the k smallest wirelength (WL) between the clusters where k is a number less than the cluster connectivity nodes. The smaller the value of k, the less chance that the exploration of the best wirelengths (WLs) and greedy solution would be chosen for k=1.

At 360, a child node of the first node is set as the end node and the child node of the next node is set as the start node. The child node of the first root node is set as the end node for the first root node and the child node of the next node (e.g., second node) is set as the start node for the next root node.

At 362, the scan chain optimization program 110a, 110b determines if the next node is the last node in the root node tour (RootNodeTour). Determining if the next node is the last node in the root node tour (RootNodeTour) is established by checking if all of the nodes in the tour have already been visited during this exploration.

If the scan chain optimization program 110a, 110b determines that the next node is not the last node in the tour, then the next node is set as the first node at 364. The process of identifying the start and end nodes is repeated for each pair of adjacent nodes in the root node tour (RootNodeTour). Once the next node is set as the first node, the next adjacent node (e.g., a third node) will be selected in the root node tour (RootNodeTour). For example, if the next node was the second node in the root node tour (RootNodeTour), then the next node chosen at step 354 may be a third node chosen.

If the scan chain optimization program 110a, 110b determines that the next node is the last node in the tour, then the choosing the best start-end nodes portion of the root node tour (RootNodeTour) ends.

It may be appreciated that FIGS. 2A-B and 3A-C provide only an illustration of one embodiment and do not imply any limitations with regard to how different embodiments may be implemented. Many modifications to the depicted embodiment(s) may be made based on design and implementation requirements.

Figure 4:
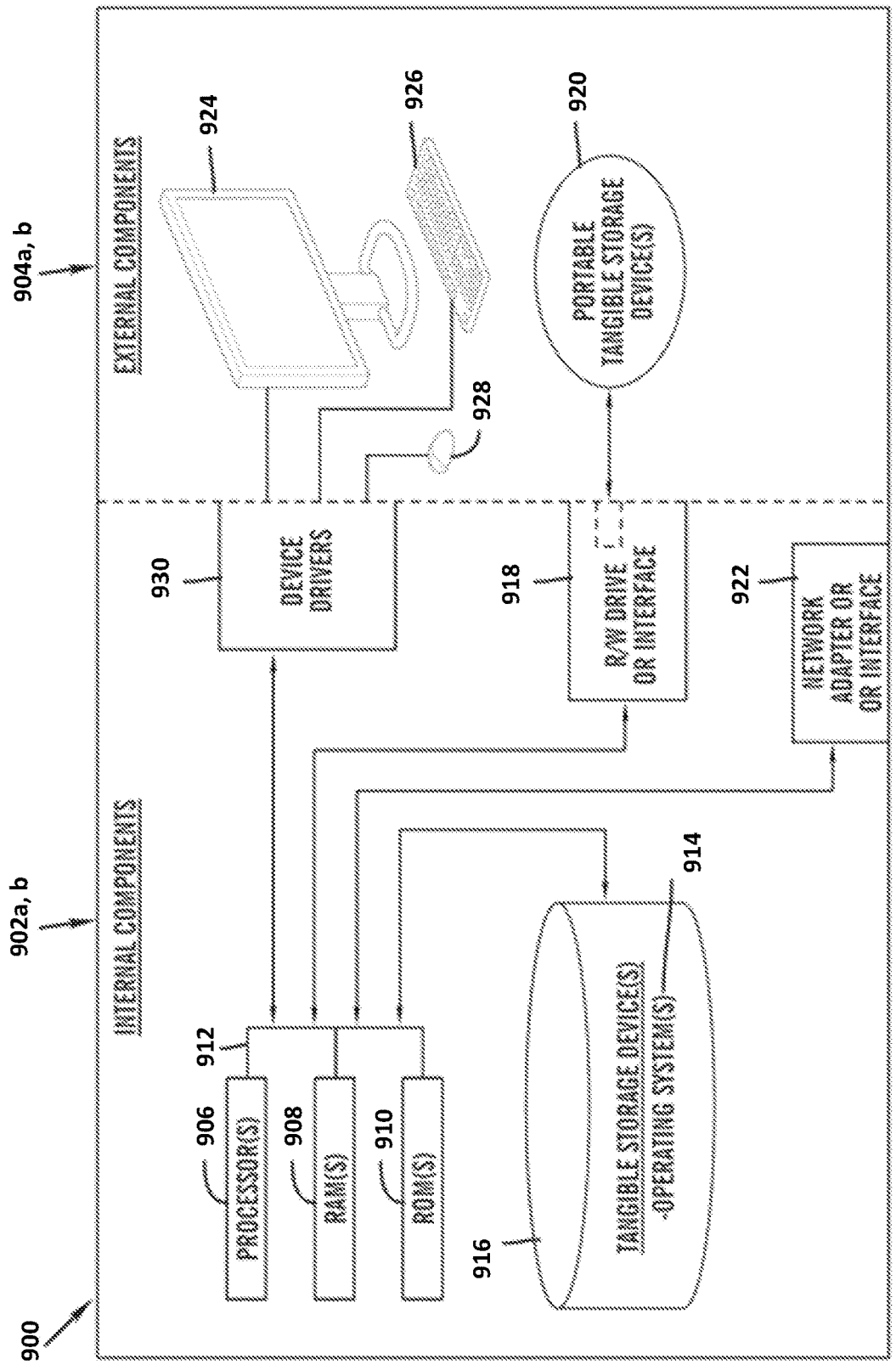
FIG. 4 is a block diagram of internal and external components of computers and servers depicted in FIG. 1 according to at least one embodiment.

FIG. 4 is a block diagram 900 of internal and external components of computers depicted in FIG. 1 in accordance with an illustrative embodiment of the present invention. It should be appreciated that FIG. 4 provides only an illustration of one implementation and does not imply any limitations with regard to the environments in which different embodiments may be implemented. Many modifications to the depicted environments may be made based on design and implementation requirements.

Data processing system 902, 904 is representative of any electronic device capable of executing machine-readable program instructions. Data processing system 902, 904 may be representative of a smart phone, a computer system, PDA, or other electronic devices. Examples of computing systems, environments, and/or configurations that may be represented by data processing system 902, 904 include, but are not limited to, personal computer systems, server computer systems, thin clients, thick clients, hand-held or laptop devices, multiprocessor systems, microprocessor-based systems, network PCs, minicomputer systems, and distributed cloud computing environments that include any of the above systems or devices.

Computer 102 and server 112 may include respective sets of internal components 902 *a, b* and external components 904 *a, b* illustrated in FIG. 4. Each of the sets of internal components 902 *a, b* includes one or more processors 906, one or more computer-readable RAMs 908 and one or more computer-readable ROMs 910 on one or more buses 912, and one or more operating systems 914 and one or more computer-readable tangible storage devices 916. The one or more operating systems 914, the software program 108, and the scan chain optimization program 110*a* in client computer 102, and the scan chain optimization program 110*b* in network server 112, may be stored on one or more computer-readable tangible storage devices 916 for execution by one or more processors 906 via one or more RAMs 908 (which typically include cache memory). In the embodiment illustrated in FIG. 4, each of the computer-readable tangible storage devices 916 is a magnetic disk storage device of an internal hard drive. Alternatively, each of the computer-readable tangible storage devices 916 is a semiconductor storage device such as ROM 910, EPROM, flash memory or any other computer-readable tangible storage device that can store a computer program and digital information.

Each set of internal components 902 *a, b* also includes a R/W drive or interface 918 to read from and write to one or more portable computer-readable tangible storage devices 920 such as a CD-ROM, DVD, memory stick, magnetic tape, magnetic disk, optical disk or semiconductor storage device. A software program, such as the software program 108 and the scan chain optimization program 110*a*, 110*b* can be stored on one or more of the respective portable computer-readable tangible storage devices 920, read via the respective R/W drive or interface 918 and loaded into the respective hard drive 916.

Each set of internal components 902 *a, b* may also include network adapters (or switch port cards) or interfaces 922 such as a TCP/IP adapter cards, wireless wi-fi interface cards, or 3G/4G/5G wireless interface cards or other wired or wireless communication links. The software program 108 and the scan chain optimization program 110*a* in the computer 102 and the scan chain optimization program 110*b* in a network server 112 can be downloaded from an external computer (e.g., server) via a network (for example, the Internet, a local area network or other, wide area network) and respective network adapters or interfaces 922. From the network adapters (or switch port adaptors) or interfaces 922, the software program 108 and the scan chain optimization program 110*a* in computer 102 and the scan chain optimization program 110*b* in network server computer 112 are loaded into the respective hard drive 916. The network may comprise copper wires, optical fibers, wireless transmission, routers, firewalls, switches, gateway computers and/or edge servers.

Each of the sets of external components 904 *a, b* can include a computer display monitor 924, a keyboard 926, and a computer mouse 928. External components 904 *a, b* can also include touch screens, virtual keyboards, touch pads, pointing devices, and other human interface devices. Each of the sets of internal components 902 *a, b* also includes device drivers 930 to interface to computer display monitor 924, keyboard 926 and computer mouse 928. The device drivers 930, R/W drive or interface 918 and network adapter or interface 922 comprise hardware and software (stored in storage device 916 and/or ROM 910).

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure or on a hybrid cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Analytics as a Service (AaaS): the capability provided to the consumer is to use web-based or cloud-based networks (i.e., infrastructure) to access an analytics platform. Analytics platforms may include access to analytics software resources or may include access to relevant databases, corpora, servers, operating systems or storage. The consumer does not manage or control the underlying web-based or cloud-based infrastructure including databases, corpora, servers, operating systems or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 5:
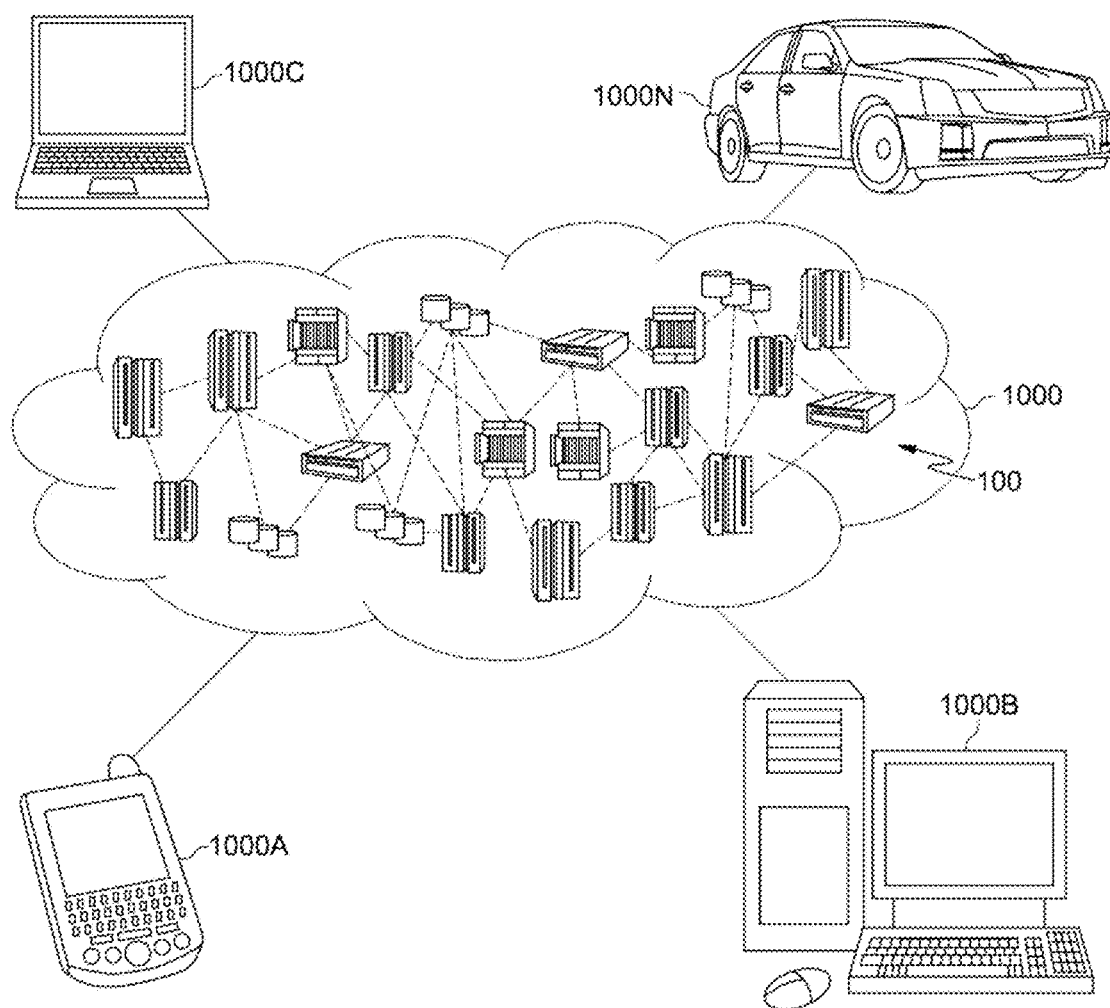
FIG. 5 is a block diagram of an illustrative cloud computing environment including the computer system depicted in FIG. 1, in accordance with an embodiment of the present disclosure.

Referring now to FIG. 5, illustrative cloud computing environment 1000 is depicted. As shown, the cloud computing environment 1000 includes one or more cloud computing nodes 1050 with which local computing devices used by cloud consumers, such as, for example, personal digital assistant (PDA) or cellular telephone 1000A, desktop computer 1000B, laptop computer 1000C, and/or automobile computer system 1000N may communicate. Cloud computing nodes 1050 may communicate with one another. They may be grouped (not shown) physically or virtually, in one or more networks, such as Private, Community, Public, or Hybrid clouds as described hereinabove, or a combination thereof. This allows cloud computing environment 1000 to offer infrastructure, platforms and/or software as services for which a cloud consumer does not need to maintain resources on a local computing device. It is understood that the types of computing devices 1000A-N shown in FIG. 5 are intended to be illustrative only and that computing nodes 1050 and cloud computing environment 1000 can communicate with any type of computerized device over any type of network and/or network addressable connection (e.g., using a web browser).

Figure 6:
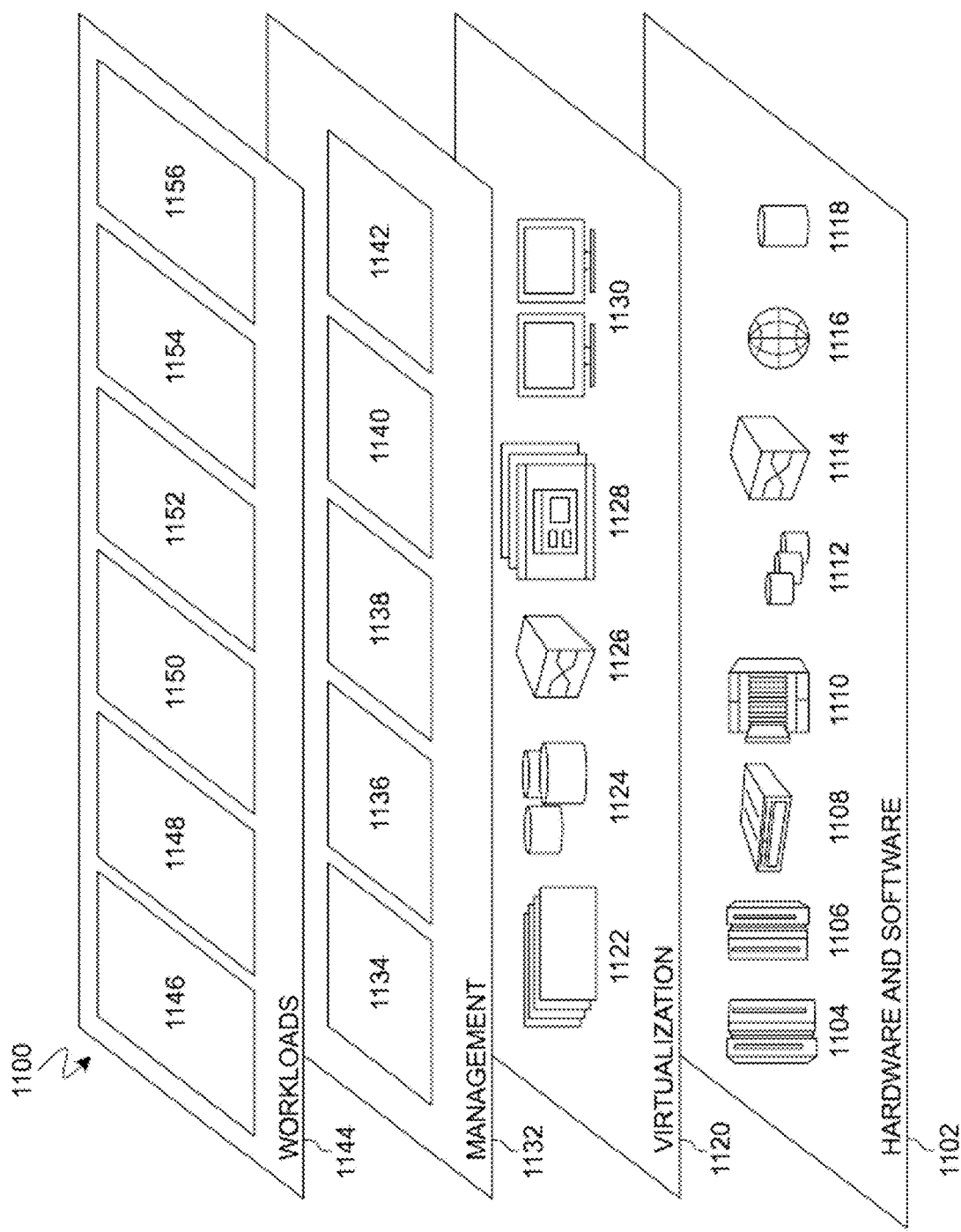
FIG. 6 is a block diagram of functional layers of the illustrative cloud computing environment of FIG. 5, in accordance with an embodiment of the present disclosure.

Referring now to FIG. 6, a set of functional abstraction layers 1100 provided by cloud computing environment 1000 is shown. It should be understood in advance that the components, layers, and functions shown in FIG. 6 are intended to be illustrative only and embodiments of the invention are not limited thereto. As depicted, the following layers and corresponding functions are provided:

A hardware and software layer 1102 include hardware and software components. Examples of the hardware components include: mainframes 1104; RISC (Reduced Instruction Set Computer) architecture based servers 1106; servers 1108; blade servers 1110; storage devices 1112; and networks and networking components 1114. In some embodiments, software components include network application server software 1116 and database software 1118.

Virtualization layer 1120 provides an abstraction layer from which the following examples of virtual entities may be provided: virtual servers 1122; virtual storage 1124; virtual networks 1126, including virtual private networks; virtual applications and operating systems 1128; and virtual clients 1130.

In one example, a management layer 1132 may provide the functions described below. Resource provisioning 1134 provides dynamic procurement of computing resources and other resources that are utilized to perform tasks within the cloud computing environment. Metering and pricing 1136 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 1138 provides access to the cloud computing environment for consumers and system administrators. Service level management 1140 provides cloud computing resource allocation and management such that required service levels are met. Service Level Agreement (SLA) planning and fulfillment 1142 provide pre-arrangement for, and procurement of, cloud computing resources for which a future requirement is anticipated in accordance with an SLA.

Workloads layer 1144 provides examples of functionality for which the cloud computing environment may be utilized. Examples of workloads and functions that may be provided from this layer include: mapping and navigation 1146; software development and lifecycle management 1148; virtual classroom education delivery 1150; data analytics processing 1152; transaction processing 1154; and scan chain optimization 1156. A scan chain optimization program 110a, 110b provides a way to optimize a scan chain wirelength using a Q-learning based reinforcement learning.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language, python programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for scan chain wirelength optimization using Q-learning, the method comprising:
    obtaining root nodes details from the root nodes;
    optimizing a connectivity of the root nodes;
    identifying a best start node and a best end node for each of the root nodes;
    optimizing child nodes in each of the root nodes, further comprising:
        initializing a Q-table for each of the root nodes;
        choosing an action based on a fixed start node and end node or based on an optimal start node and end node;
        performing the action by adding a chosen node;
        measuring a reward by measuring a total wirelength of a root node tour; and
        updating the Q-table for each of the child nodes in a child node tour;
        determining that a wirelength of a full tour is shorter or longer than a nearest neighbor; and
        applying or skipping a solution.

2. The method of claim 1, wherein optimizing the connectivity of the root nodes further comprises:
    initializing a Q-table by setting values in the Q-table to zero or to a uniform value;
    choosing an action based on a weight between two nodes or choosing at random;
    performing the action by adding a chosen node;
    measuring a reward by measuring a total wirelength of a root node tour; and
    updating the Q-table based on a root node tour wirelength.

3. The method of claim 2, wherein choosing the action further comprises:
    determining that choosing the action is random;
    finding an N nearest neighbor node;
    determining that the N nearest neighbor node has not been visited;
    measuring a closest coefficient for the N nearest neighbor node;
    determining the N nearest neighbor node is within a predetermined limit;
    adding the N nearest neighbor node to a choice list; and
    choosing a random node from the choice list.

4. The method of claim 2, wherein choosing the action further comprises:
    determining that choosing the action is not random;
    selecting a node that has not been visited in a current exploration;
    calculating a likelihood of success based on a current Q value and the wirelength; and
    choosing a node based on the calculated likelihood of success.

5. The method of claim 1, wherein identifying the best start node and the best end node for the each of the root nodes further comprises:
    reading a root node tour;
    selecting a first node in the root node tour;
    selecting a second node in the root node tour;
    calculating weights of all possible connections between the child nodes or the first node and the second node in the root node tour;
    selecting a connection with a best weight;
    setting a first child node as an end node and a second child node as a next start node;
    determining the next start node is a last node on the root node tour; and
    selecting a best start-end nodes portion of the root node tour.

6. The method of claim 1, wherein the root nodes are a collapsed representation of a group of latches that are required to be constrained together.

7. A computer system for scan chain wirelength optimization using Q-learning, comprising:
    one or more processors, one or more computer-readable memories, one or more computer-readable tangible storage media, and program instructions stored on at least one of the one or more computer-readable tangible storage media for execution by at least one of the one or more processors via at least one of the one or more computer-readable memories, wherein the computer system is capable of performing a method comprising:
        obtaining root nodes details from the root nodes;
        optimizing a connectivity of the root nodes;
        identifying a best start node and a best end node for each of the root nodes;
        optimizing child nodes in each of the root nodes, further comprising:
            initializing a Q-table for each of the root nodes;
            choosing an action based on a fixed start node and end node or based on an optimal start node and end node;
            performing the action by adding a chosen node;
            measuring a reward by measuring a total wirelength of a root node tour; and
            updating the Q-table for each of the child nodes in a child node tour;
            determining that a wirelength of a full tour is shorter or longer than a nearest neighbor; and
            applying or skipping a solution.

8. The computer system of claim 7, wherein optimizing the connectivity of the root nodes further comprises:
    initializing a Q-table by setting values in the Q-table to zero or to a uniform value;
    choosing an action based on a weight between two nodes or choosing at random;
    performing the action by adding a chosen node;
    measuring a reward by measuring a total wirelength of a root node tour; and
    updating the Q-table based on a root node tour wirelength.

9. The computer system of claim 8, wherein choosing the action further comprises:
    determining that choosing the action is random;
    finding an N nearest neighbor node;
    determining that the N nearest neighbor node has not been visited;
    measuring a closest coefficient for the N nearest neighbor node;
    determining the N nearest neighbor node is within a predetermined limit;
    adding the N nearest neighbor node to a choice list; and
    choosing a random node from the choice list.

10. The computer system of claim 8, wherein choosing the action further comprises:
    determining that choosing the action is not random;
    selecting a node that has not been visited in a current exploration;

calculating a likelihood of success based on a current Q value and the wirelength; and choosing a node based on the calculated likelihood of success.

11. The computer system of claim 7, wherein identifying the best start node and the best end node for the each of the root nodes further comprises:
 reading a root node tour;
 selecting a first node in the root node tour;
 selecting a second node in the root node tour;
 calculating weights of all possible connections between the child nodes or the first node and the second node in the root node tour;
 selecting a connection with a best weight;
 setting a first child node as an end node and a second child node as a next start node;
 determining the next start node is a last node on the root node tour; and
 selecting a best start-end nodes portion of the root node tour.

12. The computer system of claim 7, wherein the root nodes are a collapsed representation of a group of latches that are required to be constrained together.

13. A computer program product for scan chain wirelength optimization using Q-learning, comprising:
 one or more computer-readable tangible storage media and program instructions stored on at least one of the one or more computer-readable tangible storage media, the program instructions executable by a processor to cause the processor to perform a method comprising:
 obtaining root nodes details from the root nodes;
 optimizing a connectivity of the root nodes;
 identifying a best start node and a best end node for each of the root nodes;
 optimizing child nodes in each of the root nodes, further comprising:
 initializing a Q-table for each of the root nodes;
 choosing an action based on a fixed start node and end node or based on an optimal start node and end node;
 performing the action by adding a chosen node;
 measuring a reward by measuring a total wirelength of a root node tour; and
 updating the Q-table for each of the child nodes in a child node tour;
 determining that a wirelength of a full tour is shorter or longer than a nearest neighbor; and
 applying or skipping a solution.

14. The computer program product of claim 13, wherein optimizing the connectivity of the root nodes further comprises:
 initializing a Q-table by setting values in the Q-table to zero or to a uniform value;
 choosing an action based on a weight between two nodes or choosing at random;
 performing the action by adding a chosen node;
 measuring a reward by measuring a total wirelength of a root node tour; and
 updating the Q-table based on a root node tour wirelength.

15. The computer program product of claim 14, wherein choosing the action further comprises:
 determining that choosing the action is random;
 finding an N nearest neighbor node;
 determining that the N nearest neighbor node has not been visited;
 measuring a closest coefficient for the N nearest neighbor node;
 determining the N nearest neighbor node is within a predetermined limit;
 adding the N nearest neighbor node to a choice list; and
 choosing a random node from the choice list.

16. The computer program product of claim 14, wherein choosing the action further comprises:
 determining that choosing the action is not random;
 selecting a node that has not been visited in a current exploration;
 calculating a likelihood of success based on a current Q value and the wirelength; and
 choosing a node based on the calculated likelihood of success.

17. The computer program product of claim 13, wherein identifying the best start node and the best end node for the each of the root nodes further comprises:
 reading a root node tour;
 selecting a first node in the root node tour;
 selecting a second node in the root node tour;
 calculating weights of all possible connections between the child nodes or the first node and the second node in the root node tour;
 selecting a connection with a best weight;
 setting a first child node as an end node and a second child node as a next start node;
 determining the next start node is a last node on the root node tour; and
 selecting a best start-end nodes portion of the root node tour.

* * * * *